United States Patent
Ganev et al.

(10) Patent No.: US 7,295,440 B2
(45) Date of Patent: Nov. 13, 2007

(54) INTEGRAL COLD PLATE/CHASSES HOUSING APPLICABLE TO FORCE-COOLED POWER ELECTRONICS

(75) Inventors: Evgeni Ganev, Torrance, CA (US); Robert A. Dietrich, Montebello, CA (US); Michael A. Quan, Torrance, CA (US)

(73) Assignee: Honeywell International, Inc., Morristown, NJ (US)

( * ) Notice: Subject to any disclaimer, the term of this patent is extended or adjusted under 35 U.S.C. 154(b) by 63 days.

(21) Appl. No.: 11/370,966

(22) Filed: Mar. 7, 2006

(65) Prior Publication Data

US 2007/0211435 A1    Sep. 13, 2007

(51) Int. Cl.
*H05K 7/20* (2006.01)

(52) U.S. Cl. ............... 361/714; 361/699; 361/715; 361/717; 165/80.4; 174/16.3; 174/50; 174/50.52; 174/520; 312/223.1

(58) Field of Classification Search ............ 361/698, 361/699, 700–712, 714–717; 257/713–715; 165/80.3, 80.4, 185, 104.33; 312/223.1, 312/223.2, 223.3; 174/16.3, 50, 50.5, 50.52, 174/520, 17 R, 17.06, 17.08, 17 LF; 62/259.2
See application file for complete search history.

(56) References Cited

U.S. PATENT DOCUMENTS

| 4,120,021 A | 10/1978 | Roush |
| 4,468,717 A * | 8/1984 | Mathias et al. ............. 361/702 |
| 4,714,107 A | 12/1987 | Adsett |
| 4,998,584 A | 3/1991 | Foglesonger et al. |
| 5,159,529 A | 10/1992 | Lovgren et al. |
| 5,620,646 A | 4/1997 | Sparer et al. |
| 6,292,365 B1 * | 9/2001 | Ashiwake et al. .......... 361/700 |

FOREIGN PATENT DOCUMENTS

| WO | WO 02/35898 A1 * | 5/2002 |
| WO | WO 2006/105835 A2 * | 10/2006 |

OTHER PUBLICATIONS

The Article "Hermetically sealed, field removable module having integral pump and coolant heat exchanger for connection immersion cooling of electronic circuit modules", IBM Technical Disclosure Bulletine, Sep. 1992, vol. 35, Issue 4B, pp. 443-444.*

* cited by examiner

*Primary Examiner*—Michael Datskovskiy
(74) *Attorney, Agent, or Firm*—Oral Caglar, Esq.

(57) ABSTRACT

An integral cold plate/chassis (ICPC) housing may be formed from two blocks of material, having a cold plate sandwiched therebetween, brazed together. The blocks may then be machined to fit power electronics therein, thereby providing a cold plate as an integral part of the power electronic's housing. Unlike conventional heat exchangers that may be used to dissipate heat from power-dissipating components that are housed typically in sheet metal housings, the ICPC described herein provides a cold plate integral to the housing of power electronics, thereby allowing the rapid and efficient removal of heat from the components into the cold plate carrier fluid and out of the system.

23 Claims, 4 Drawing Sheets

US 7,295,440 B2

INTEGRAL COLD PLATE/CHASSES HOUSING APPLICABLE TO FORCE-COOLED POWER ELECTRONICS

BACKGROUND OF THE INVENTION

The present invention generally relates to a chasses housing for power electronics and, more specifically, to an integral cold plate/chassis (ICPC) housing for force-cooled power electronics.

The power electronics for aerospace applications plays a significant role in the modern aircraft and spacecraft industry. This is particularly true in the area of more electric architecture (MEA) for aircraft and military ground vehicles.

The commercial aircraft business is moving toward non-bleed air environmental control systems (ECS), variable-frequency (VF) power distribution systems and electrical actuation. Typical examples include the latest designs, such as the Boeing 7E7 and the Airbus jumbo A380. The next-generation Boeing airplane (replacement of 737), and the Airbus airplane (replacement of A320), will most likely use MEA. Some military aircraft already utilize MEA, including primary and secondary flight control. Military ground vehicles have migrated toward hybrid electric technology where the main propulsion is electric drives. Therefore substantial demand for power utilization has arisen.

Resulting from these tendencies is a significant increase in power conversion needs. Non-bleed ECS's need additional electric drives for vapor cycle system (VCS) compressors, condenser fans and liquid pumps. A large number of electric drives for fans are required. In constant-frequency applications, these fans have used predominantly direct drive (no power electronics) to an induction machine. In the new environment, a double power electronics conversion AC to DC and DC to AC is required. Auxiliary power unit (APU) and main engine electric start imposes a need for high-power, multiple-use controllers. Military aircraft require high-voltage (270-Vdc) power conversions multiple times. Flight Control Systems (FCS) have moved toward 610-VDC power distribution system where high-power bidirectional propulsion is being used for driving and dynamic braking. The power generation is achieved by a main engine shaft driving a large electric machine(s). Again, bidirectional conversion is required for power conditioning and self-starting.

In this environment, it is obvious that there is a need for power converters and motor controllers for aircraft and ground military businesses for increased power levels conversion capabilities to handle increased loads; reduced controller weights to be able to accommodate large content increase per platform; reduced volume to accommodate electronics housings in limited compartments space; increased reliability for achieving reasonable mission success; and reduced cost for affordability.

The power range for power conversion and motor control units varies from hundreds of watts to hundreds of kilowatts. The efficiency of these converters varies from 80 to 97%. Therefore, heat rejection from 3 to 20% of the total converted power is required. For power conversion levels above several kilowatts, forced cooling is typically needed to achieve acceptable power density levels. The forced cooling is either air or liquid. The proper utilization of the coolant flow is achieved by using special devices called cold plates both for liquids and for air.

Cold plates with double-sided population of components and brazed fins are very popular in the industry because they provide greater utilization of surfaces. The brazing process forms a sandwich-like construction in which fins are permanently attached to two inner planes of the two flat metal side pieces. At the same time, containment for the air or liquid flow is achieved. The outer surfaces of the side pieces are available for installing power-dissipating components. In some cases, the cold plate can be used as a structural carrier for heavy components.

The remaining parts of the housing are typically made from sheet metal pieces preformed, bended, punched, drilled and then bolted to the heat exchanger, or glued, or glued and bolted. These parts can be machined from solid aluminum material, instead of using metal sheet, and assembled by using similar methods.

This method, and variations of it, contains a large number of machining and manual operations. Also material utilization is not optimized. The result is a heavy and expensive housing.

As can be seen, there is a need for a new construction and fabrication process for power electronics housings with improved performance and reduced cost that can improve power density, reliability and water splash resistance.

SUMMARY OF THE INVENTION

In one aspect of the present invention, a cold plate/chassis housing comprises a first block and a second block attached together at a first surface of the first block and a second surface of the second block; a cut-out in at least one of the first surface and the second surface; a first and a second channel in at least one of the first surface and the second surface, the first and second channel creating fluid communication between the cut-out and an exterior of the cold plate/chassis housing; at least one first block chamber in the first block; and at least one second block chamber in the second block.

In another aspect of the present invention, an integral cold plate/chassis housing for containing power electronics therein, the integral cold plate/chassis housing comprises a first aluminum block and a second aluminum block brazed together at a first surface of the first aluminum block and a second surface of the second aluminum block; a cut-out in at least one of the first surface and the second surface; a first and a second channel in at least one of the first surface and the second surface, the first and second channel creating fluid communication between the cut-out and an exterior of the cold plate/chassis housing; a cold plate fin fit into the heat exchanger fin cut-out; at least one first block chamber in the first block; at least one second block chamber in the second block; and a first lid and a second lid adapted to cover the at least one first block chamber and the at least one second block chamber, respectively.

In yet another aspect of the present invention, a method of cooling electronic components comprises manufacturing an integral cold plate/chassis housing by brazing a first surface of a first block to a second surface of a second block, at least one of the first surface and the second surface having cut-out formed therein and a first channel and a second channel formed therein, the first and second channel communicating the cut-out with an exterior of the integral cold plate/chassis; placing the electronic components into chambers cut into at least one of the first block and the second block; and passing a cooling fluid through the first channel, into the cut-out and out through the second channel.

In a further aspect of the present invention, a method for the fabrication of an integral cold plate/chassis comprises providing a first block and a second block; machining at least one of a first surface of the first block and a second surface of the second block to form a cut-out region; machining at least one of the first surface and the second surface to form a first channel and a second channel therein, the first channel and the second channel creating a fluid communication between the cut-out region and an exterior of the integral cold plate/chassis; fitting a cold plate fin into the cut-out region; attaching the first surface and the second surface together; machining at least one chamber in at least one of the first block and the second block.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention provides a chasses housing for power electronics and, more specifically, to an integral cold plate/chasses (ICPC) housing for force-cooled power electronics. As will be discussed in greater detail below, the ICPC of the present invention may be formed from two blocks of material, having a cold plate sandwiched between, being brazed together. The blocks may then be machined to fit power electronics therein, thereby providing a cold plate as an integral part of the power electronics' housing. Unlike the prior art, wherein conventional cold plates may be used to dissipate heat from power-dissipating components housed typically in sheet metal housings, the present invention provides a cold plate integral to the housing of power electronics, thereby allowing the rapid and efficient removal of heat from the components into the cold plate carrier fluid and out of the system. The ICPC of the present invention may find application in any system requiring the removal of heat from components. As examples, the ICPC of the present invention may be useful in the modern aircraft, spacecraft and ground vehicle technologies.

As used herein, the terms "first," "second" and so forth, herein do not denote any order, quantity, or importance, but rather are used to distinguish one element from another, and the terms "a" and "an" herein do not denote a limitation of quantity, but rather denote the presence of at least one of the referenced item.

Figure 1A:
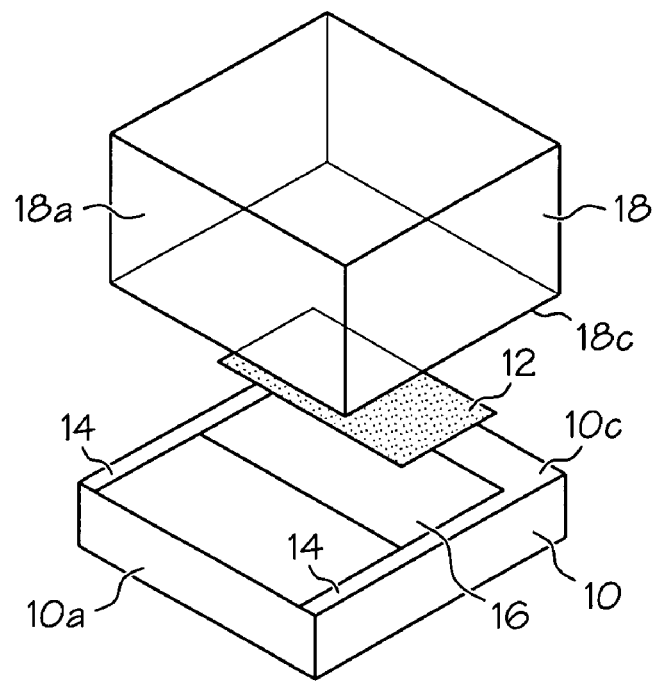
FIG. 1A is a disassembled perspective view of a cold plate/chassis according to the present invention.
Figure 1B:
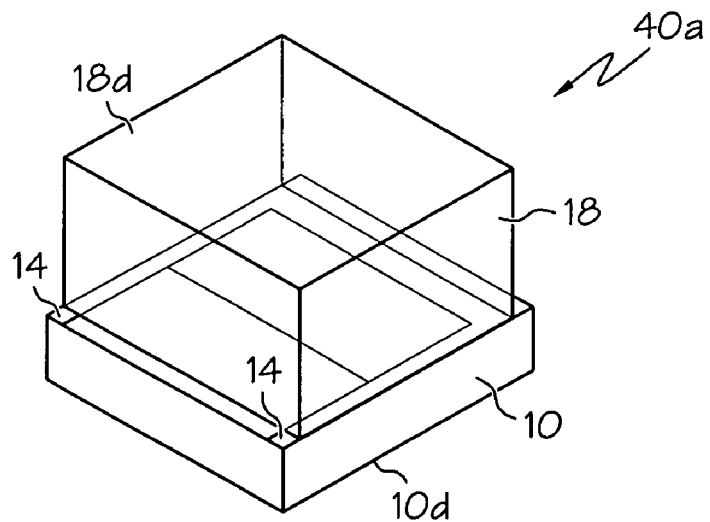
FIG. 1B is a partially assembled perspective view of the cold plate/chassis of FIG. 1A.
Figure 1C:
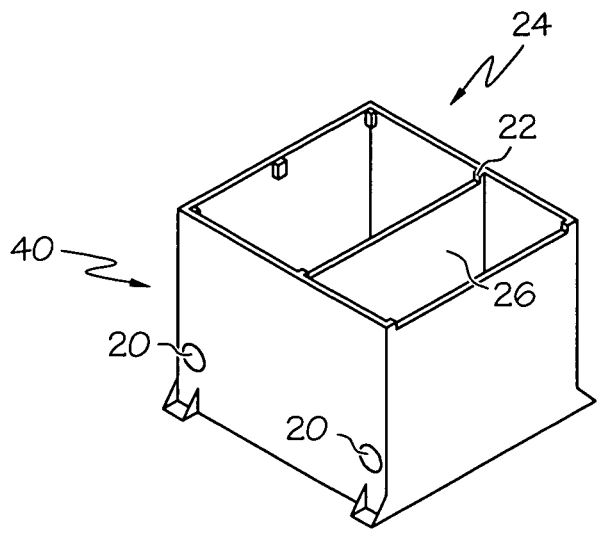
FIG. 1C is an assembled perspective view of the cold plate/chassis of FIG. 1A.

Referring to FIGS. 1A through 1C, there are shown perspective drawings depicting the sequence of events in a method for making an ICPC 40 of the present. First, two blocks of material having a sufficiently high thermal conductivity capable of transferring the heat away from a particular system, for example, first and second blocks 10, 18 may be preformed. First and second blocks 10, 18 may be made from a material comprising, as non-limiting examples, aluminum or magnesium. At least one of a first surface 10c of the first block 10 and a second surface 18c of the second block 18 may be machined to form a cut-out 16 where a cold plate fin 12 may be accommodated. Moreover, at least one of first and second surfaces 10c, 18c may be machined to provide channels 14 to communicate cut-out 16 with a side 10a, 18a of first and second blocks 10,18. If both the first and second surfaces 10c, 18c are machined to provide the channels 14 of the cut-out 16, these regions are machined such that these regions are aligned when the first block 10 is mated to the second block 18 as shown in FIG. 1C to form ICPC 40.

The cold plate fins 12 may be placed in cut-out 16 and first block 10 may be attached to second block 18 as shown in FIG. 1B. First and second blocks 10, 18 may be attached by any conventional means, including, for example, brazing. After completion of the attaching/brazing process, the resulting assembly 40a may be machined to form chambers 24 for internal components (not shown, described below). Chambers 24 may include at least one chamber 24 in the first block 10, as shown in FIG. 1C, and at least one chamber (not shown) in the second block of aluminum 18. Chambers 24 may be machined in opposite surface 10d, 18d of first and second surfaces 10c, 18c, respectively. A chamber divider 26 may be machined into chamber 24 (or later fitted by any conventional means into chamber 24), thereby separating chamber 24 into more than one compartment.

Finally, a first and second lid 10b, 18b (see FIG. 2B) may be fabricated to cover chambers 24. Lids 10b, 18b may be, for example, fabricated by using aluminum sheet metal or may be machined from solid blocks. Lids 10b, 18b may be attached via any known removable attachment means, such as with bolts and nuts 22. Lids 10b, 18b may also by fabricated from a material different from that used for first and second blocks 10, 18. For example, lids 10b, 18b may be fabricated from a plastic material suitable for the temperature range of the ICPC 40. A gasket 38 (see FIG. 2C) may be placed between the lids 10b, 18b and the chambers 24 to prevent fluid movement from an exterior of the ICPC into the chambers 24.

Once first and second blocks 10, 18 are attached together, holes 20 may be machined in the side 10a, 18a of blocks 10, 18. These holes 20 may be used to pass a cooling fluid (not shown) to cold plate fins 12 via channels 14. The cooling fluid may be any conventional cooling fluid, including air, ethylene glycol, poly alpha olefin (PAO), oil, water, propylene glycol/water (PGW) and the like.

Figure 2A:
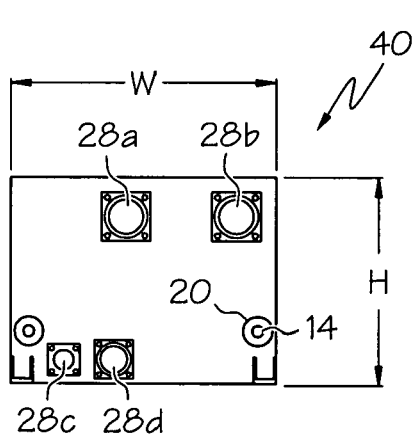
FIG. 2A is front view of a cold plate/chassis according to the present invention.
Figure 2B:
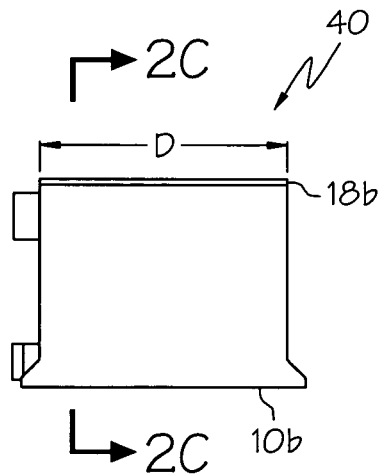
FIG. 2B is a side view of the cold plate/chasses of FIG. 2A.

Referring now to FIGS. 2A and 2B, there are shown front and side views, respectively, of ICPC 40. From the front view of FIG. 2A, holes 20 may be seen in addition to channel 14. Ports 28c, 28d may be used to provide exterior access to chambers 24 in first block 10 (bottom of the ICPC 40, as viewed in the figures), while ports 28a, 28b may be used to provide exterior access to chambers 24 in second block 18. Ports 28a, 28b, 28c and 28d may be used to pass electrically conducting cables, sensors and the like from outside the ICPC 40 to the inside chambers 24 of the ICPC 40. Dimensions W, H, and D of the ICPC 40 may be chosen to suit the particular quantity and size of components that are to be contained therein. In aircraft, by way of non-limiting example, when the ICPC 40 is used as a motor controller, each dimension W, H, and D of the ICPC 40 may be from about 6 to about 16 inches, and, in an exemplary embodiment of the invention, may be from about 8 to about 12 inches.

Figure 2C:
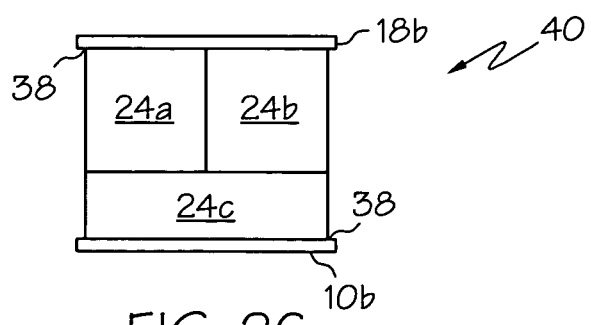
FIG. 2C is a cut-away view along line 2C-2C of FIG. 2B.

Referring to FIG. 2C, there is shown a cut-away view of the ICPC 40 as viewed along line 2C-2C of FIG. 2B. The first block 10 may include a single chamber 24c (also referred to as a first block chamber 24c), while the second block 18 may be divided into two chambers 24a, 24b (also referred to as first block chambers 24a, 24b)with the chamber divider 26. While the example of FIG. 2C shows three chambers 24a, 24b, 24c in the ICPC 40, the invention is not meant to be so limited. Any number of chambers 24 may be included in both first and second blocks 10, 18 depending on the components to be contained in each.

Figure 3A:
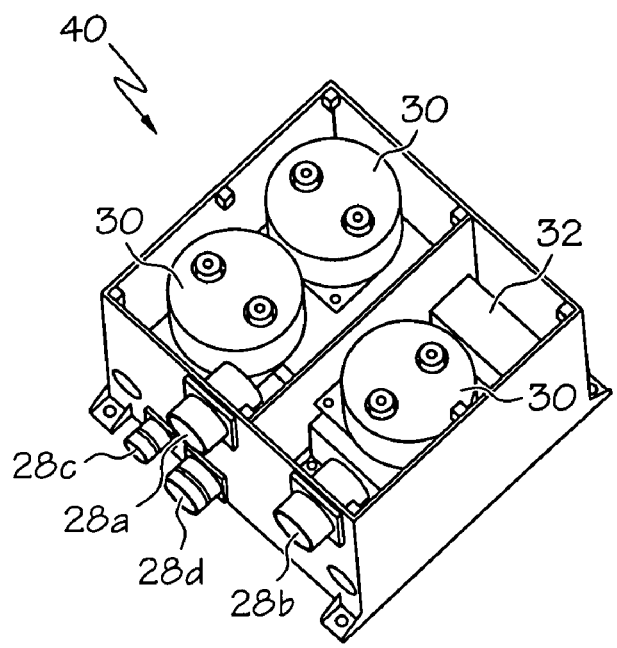
FIG. 3A is a plan-perspective view of a cold plate/chassis according to the present invention with a top cover removed.
Figure 3B:
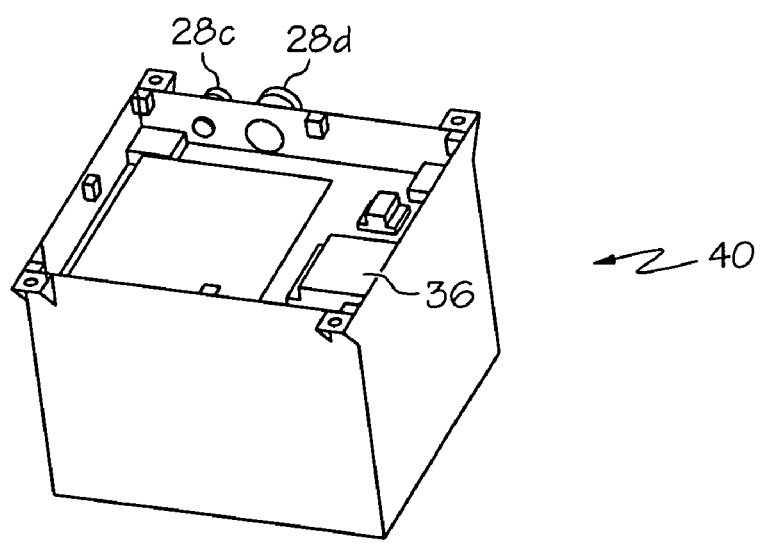
FIG. 3B is a bottom-perspective view of a cold plate/chassis according to the present invention with a bottom cover removed.

Referring to FIGS. 3A and 3B, there are shown top and bottom views of the ICPC 40 with lids 10b and 18b (see FIGS. 2A, 2B) removed. Power components 30, 32 may be housed in first and second chambers 24a, 24b previously formed in second block 18. Ports 28a, 28b may communicate first and second chambers 24a, 24b, respectively, with the exterior of the ICPC 40. Power components 36 may be housed in third chamber 24c formed in first block 10. Ports 28c, 28d may communicate the third chamber 24c with the exterior of the ICPC 40. Power components 30, 32, 36 may be any components that generate heat during use, such as, but not limited to, EMI filters, inverters and signal electronics. While the above description included first and second chambers 24a, 24b in second block 18 and a single third chamber 24c in the first block 10, any number of chambers may be formed in each first and second blocks 10, 18.

Figure 4:
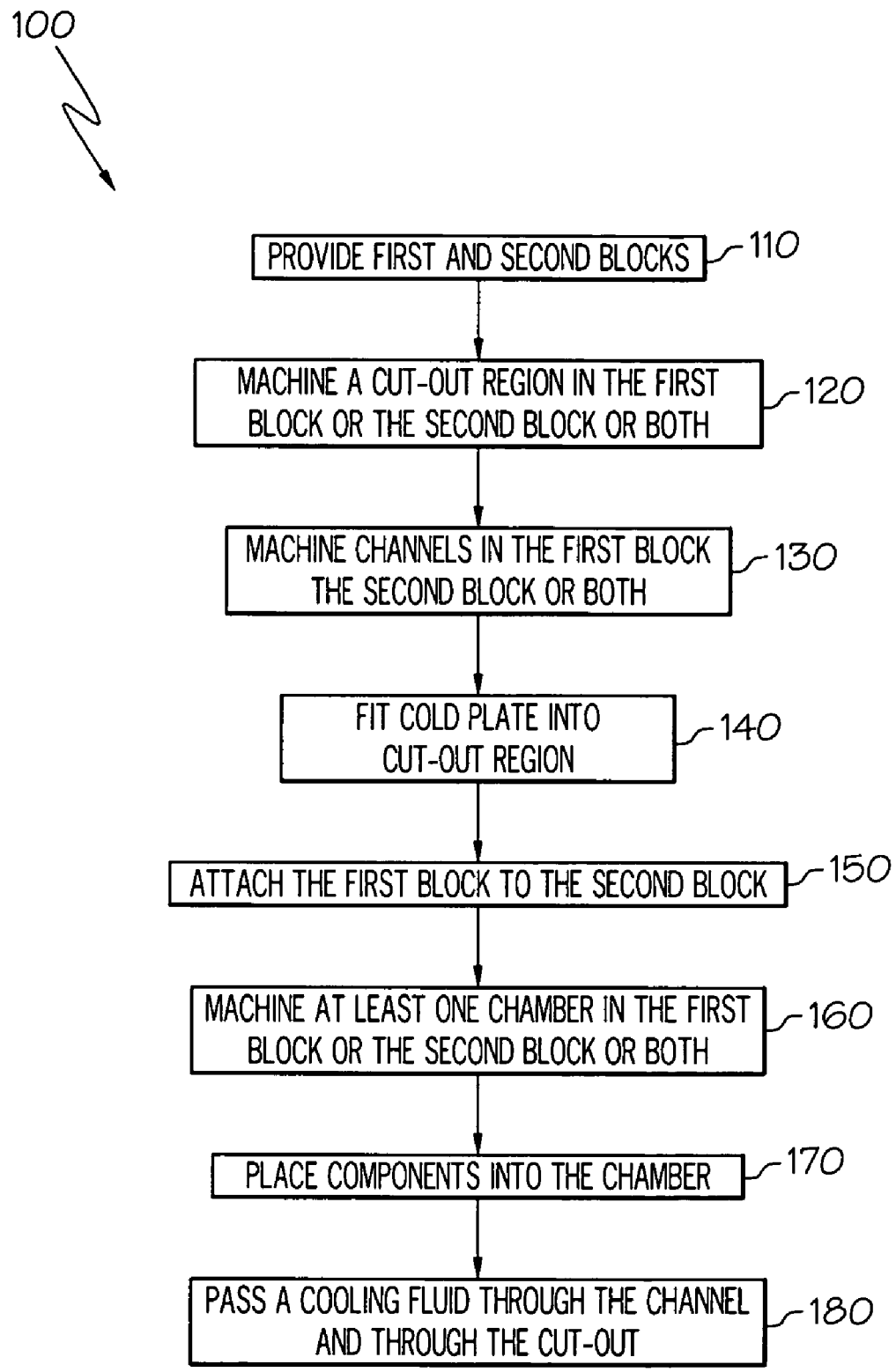
FIG. 4 is a flow chart describing a method according to the present invention.

Referring to FIG. 4, there is shown a method 100 for making and using the ICPC 40 of the present invention. The first and second blocks 10, 18 are provided in a step 110. The cut-out 16 may be machined into at least one of a first surface 10c of the first block 10 and the second surface 18c of the second block 18 in step 120. In step 130, channels 14 may be machined in a manner similar to that of cut out 16, such that the channels 14 provide a path for cooling fluid into cut-out 16 and out of cut-out 16 when the first surface 10c and the second surface 18c are attached together as described in step 150. In step 160, at least one chamber 24 may be machined into at least one of the first block 10 and the second block 18. The above step 110, 120, 130, 140, 150, 160 may be used to form ICPC 40.

The ICPC 40 formed above may then by used to cool components 32, 34, 36. In step 170, the components may be placed into the chamber and a cooling fluid may be passed through channels 14 and fin cut-out 16, thereby absorbing the heat generated by the components.

While the above description generically describes the cooling using a cold plate, any known means may be used to affect cooling between the two plates. For example, a heat exchanger comprising a plurality of heat exchanger fins (not shown) may be used between the two plates. The resulting integral heat exchanger/chassis housing (ICPC) may be used to efficiently cool components stored therein.

The present invention may provide significant advances over conventional heat sinking methods and apparatus. The ICPC of the present invention may improve the structural integrity of the housing and the cold plate. There may be flexibility to machine walls and provisions or reinforcement to optimize thicknesses. Variable thicknesses can also be implemented, as opposed to conventional sheet metal approaches.

The ICPC of the present invention may also reduce weight due to optimized structural integrity. The ICPC of the present invention may not require overlapping of materials and thicker material for mechanical joints.

The ICPC of the present invention may realize several other benefits over conventional cold plates and/or chassis. For example, the ICPC of the present invention results in reduced manufacturing costs, improved reliability, improved splash prevention and water resistance, improved EMI performance, improved grounding resistance, improved manufacturing yield and improved internal surface flatness.

It should be understood, of course, that the foregoing relates to exemplary embodiments of the invention and that modifications may be made without departing from the spirit and scope of the invention as set forth in the following claims.

We claim:

1. A cold plate/chassis housing comprising:
a first block and a second block attached together at a first surface of the first block and a second surface of the second;
a cut-out in at least one of the first surface and the second surface;
a first and a second channel in at least one of the first surface and the second surface, the first and second channel creating fluid communication between the cut-out and an exterior of the cold plate/chassis housing;
at least one first block chamber in the first block; and
at least one second block chamber in the second block.

2. The cold plate/chassis housing according to claim 1, further comprising a cold plate fin fit into the cut-out.

3. The cold plate/chassis housing according to claim 2, wherein the cold plate fin comprises a plurality of heat exchanger fins.

4. The cold plate/chassis housing according to claim 1, wherein the first block and the second block comprise aluminum.

5. The cold plate/chassis housing according to claim 1, wherein the first block and the second block are attached to form an integral unit via brazing.

6. The cold plate/chassis housing according to claim 1, wherein at least one of the first block chamber and the second block chamber includes at least one chamber divider, thereby forming multiple chambers therein.

7. The cold plate/chassis housing according to claim 1, further comprising at least a first and a second port communicating each of the at least one first block chamber and the at least one second block chamber, respectively, with an exterior of the cold plate/chassis housing.

8. The cold plate/chassis housing according to claim 1, further comprising a first lid and a second lid adapted to cover the at least one first block chamber and the at least one second block chamber, respectively.

9. The cold plate/chassis housing according to claim 8, wherein the first lid and the second lid are attached to the cold plate/chassis housing with bolts.

10. The cold plate/chassis housing according to claim 8, further comprising a gasket capable of preventing fluid movement from an exterior of the cold plate/chassis housing to the at least one first block chamber and the at least one second block chamber.

11. An integral cold plate/chassis housing for containing power electronics therein, the integral cold plate/chassis housing comprising:

a first aluminum block and a second aluminum block brazed together at a first surface of the first aluminum block and a second surface of the second aluminum block;

a cut-out in at least one of the first surface and the second surface;

a first and a second channel in at least one of the first surface and the second surface, the first and second channel creating fluid communication between the cut-out and an exterior of the cold plate/chassis housing;

a cold plate fin fit into the cut-out;

at least one first block chamber in the first block;

at least one second block chamber in the second block; and a first lid and a second lid adapted to cover the at least one first block chamber and the at least one second block chamber, respectively.

12. The cold plate/chassis housing according to claim 11, wherein at least one of the first block chamber and the second block chamber includes at least one chamber divider, thereby forming multiple chambers therein.

13. The cold plate/chassis housing according to claim 11, further comprising at least a first and a second port communicating each of the at least one first block chamber and the at least one second block chamber, respectively, with an exterior of the cold plate/chassis housing.

14. The cold plate/chassis housing according to claim 11, further comprising a gasket capable of preventing fluid movement from an exterior of the cold plate/chassis housing to the at least one first block chamber and the at least one second block chamber.

15. The cold plate/chassis housing according to claim 11, wherein the cold plate fin comprises a plurality of heat exchanger fins.

16. A method of cooling electronic components comprising:

manufacturing an integral cold plate/chassis housing by brazing a first surface of a first block to a second surface of a second block, at least one of the first surface and the second surface having a cut-out formed therein and a first channel and a second channel formed therein, the first and second channel communicating the cut-out with an exterior of the integral cold plate/chassis;

placing the electronic components into chambers formed into at least one of the first block and the second block; and passing a cooling fluid through the first channel, into the cut-out and out through the second channel.

17. The method according to claim 16, further comprising sealing the chambers with at least one lid.

18. The method according to claim 16, wherein the first block and the second block comprise aluminum.

19. The method according to claim 16, wherein the cooling fluid is selected from the group consisting of air, poly alpha olefin, ethylene glycol and polypropylene glycol/water.

20. A method for the fabrication of an integral cold plate/chassis, the method comprising:

providing a first block and a second block;

machining at least one of a first surface of the first block and a second surface of the second block to form a cut-out region;

machining at least one of the first surface and the second surface to form a first channel and a second channel therein, the first channel and the second channel creating a fluid communication between the cut-out region and an exterior of the integral cold plate/chassis;

fitting a cold plate fin into the cut-out region;

attaching the first surface and the second surface together;

machining at least one chamber in at least one of the first block and the second block.

21. The method according to claim 20, wherein the first block and the second block comprise aluminum.

22. The method according to claim 20, wherein the first surface and the second surface are attached together by brazing.

23. The method according to claim 20, further comprising fabricating at least one lid adapted to fit over the at least one chamber.

* * * * *